United States Patent
Wake

(10) Patent No.: US 6,980,475 B2
(45) Date of Patent: Dec. 27, 2005

(54) SEMICONDUCTOR MEMORY DEVICE

(75) Inventor: Hiroki Wake, Chiba (JP)

(73) Assignee: Seiko Instruments Inc., Chiba (JP)

( * ) Notice: Subject to any disclaimer, the term of this patent is extended or adjusted under 35 U.S.C. 154(b) by 142 days.

(21) Appl. No.: 10/761,954

(22) Filed: Jan. 21, 2004

(65) Prior Publication Data

US 2004/0165451 A1    Aug. 26, 2004

(30) Foreign Application Priority Data

Jan. 22, 2003    (JP) .............................. 2003-013801

(51) Int. Cl.⁷ .............................................. G11C 7/00

(52) U.S. Cl. .................. 365/189.09; 365/201; 365/200

(58) Field of Search .......................... 365/189.09, 201, 365/226

(56) References Cited

U.S. PATENT DOCUMENTS

| | | | |
|---|---|---|---|
| 4,321,489 A * | 3/1982 | Higuchi et al. ................ 327/76 |
| 6,081,460 A * | 6/2000 | Lim et al. .............. 365/189.11 |
| 6,081,466 A * | 6/2000 | McClure et al. ............ 365/201 |
| 6,333,880 B1 * | 12/2001 | Mitsui ........................ 365/201 |
| 6,791,894 B2 * | 9/2004 | Nagai et al. ................ 365/226 |

* cited by examiner

Primary Examiner—Tan T. Nguyen
(74) Attorney, Agent, or Firm—Adams & Wilks

(57) ABSTRACT

A semiconductor memory device has an external terminal receptive of a voltage for switching an operation mode. A protective transistor is connected between the external terminal and a ground. The protective transistor has a drain region and a gate electrode surrounding the drain region. A voltage detection circuit detects a voltage of the external terminal and outputs a switching signal for switching a first operation mode to a second operation mode when a value of the detected voltage is equal to or higher than a preselected voltage value.

15 Claims, 4 Drawing Sheets

SEMICONDUCTOR MEMORY DEVICE

BACKGROUND OF THE INVENTION

1. Field of the Invention

The present invention relates to a semiconductor memory device, and, more specifically, to an electrically rewritable nonvolatile semiconductor memory integrated circuit (electrically erasable programmable read only memory) (hereinafter, referred to as EEPROM). The invention also relates to a semiconductor memory device including a circuit having a test operation mode different from a general operation mode, which can switch an operation mode to the test operation mode by applying to a predetermined external terminal a voltage not smaller than a recommended voltage for the general operation mode.

2. Description of the Related Art

A conventional semiconductor memory device has a function of switching to the a test operation mode by applying a high voltage to an external terminal. The high voltage used herein means a voltage beyond a range of a power source voltage applied in the general operation mode. For example, if a maximum operation power source voltage of an integrated circuit (IC) is 5 V, the voltage higher than 5 V corresponds to the "high voltage". For example, a high voltage of about 10 V is generally applied.

To realize the above function, a voltage detection circuit for detecting the high voltage is incorporated. In the foregoing example, a detection voltage of the voltage detection circuit is set to more than 5 V and less than 10 V (in general, 9 V) and thus, the voltage of 10 V is applied to the predetermined external terminal. As a result, the voltage detection circuit outputs a detection signal to switch the operation mode to the test operation mode. The detection voltage is determined according to a specification regarding the maximum operation power source voltage and device characteristics of a semiconductor process used. Thus, it is conceivable to adopt a voltage condition other than that of the above example.

The external terminal applied with the high voltage is a terminal exclusively dedicated to detection of the test operation mode without having other functions. Also, the external terminal is a power source voltage application terminal and may double as a terminal for the power source voltage application and a terminal having the function of detecting the voltage for switching the mode to the test operation mode. Also, the external terminal serves as an input terminal, an output terminal, or an input/output terminal and may have both of a function specific to the corresponding terminal and the function of detecting the voltage for switching the mode to the test operation mode (e.g., refer to JP 2002-15599 A (pp. 2–4, FIG. 1)).

A conventional voltage detection circuit for detecting the test operation mode involves the following problem. FIG. 2 is a block diagram showing an external terminal 21 having a function of detecting a test operation mode, a voltage detection circuit 23 for detecting a test operation mode, and a protective transistor 22 for protecting the IC when being subjected to an electrostatic noise.

FIG. 3 is a circuit diagram showing a conventional voltage detection circuit. The circuit is constituted of a pad 31 to which a high voltage is applied for switching the mode to the test operation mode, an n number of NMOS transistors 32, a resistor 33, and an inverter 34. The NMOS transistors 32 and the resistor 33 are connected in series between the pad 31 and the ground voltage. A high voltage side of the resistor 3 serves as an input terminal of the inverter 34. In this circuit, when the pad 31 is applied with the voltage higher than a total value (n×Vth) of threshold voltages of the NMOS transistors 32 connected in series in n stages, an output level of the inverter 34 is inverted from an H level to an L level, thereby switching the mode to the test operation mode.

The protective transistor 22 shown in FIG. 2 is generally an NMOS transistor and also an off-transistor where a gate voltage and a source voltage are connected to the ground and a drain voltage is connected to the pad. As a MOS structure of the protective transistor, the transistor of the MOS structure showing a lower drain breakdown voltage of the off-transistor than the NMOS transistor used in the voltage detection circuit is used. Thus, the protective transistor undergoes the breakdown ahead of an internal transistor to be protected to achieve a function of protecting an internal circuit.

The drain voltage of the protective transistor is also connected to the drain of the NMOS transistor, which is connected to the pad of the voltage detection circuit as mentioned above.

Accordingly, the detection voltage of the voltage detection circuit should be set lower than the drain breakdown voltage of the protective transistor. Assuming that the detection voltage is set higher than the drain breakdown voltage of the protective transistor, even if the voltage not smaller than the breakdown voltage is applied, the protective transistor causes the breakdown and the voltage not smaller than the breakdown voltage is not applied. As a result, the voltage detection circuit cannot detect the objective voltage, which specifically means that the mode cannot be switched to the test operation mode.

FIG. 4 is a graph showing a relationship between the voltage applied to the pad and a current flowing through the NMOS transistors connected in series in the voltage detection circuit.

When the voltage applied to the pad increases, the current corresponding to the applied voltage is caused to flow into the voltage detection circuit. If the detection voltage (n×Vth) is applied thereto, the mode is switched to the test operation mode as mentioned above. With the applied voltage lower than the detection voltage, the current less than the detection current flows into the voltage detection circuit.

In the power source voltage range of the general operation mode, the current leads to a leak current at the terminal; in general, the leak current needs to be set to a constant current value or smaller from the viewpoint of IC specification of the EEPROM. In particular, the leak current increases during a low-temperature operation and thus, the leak current in the power source voltage range in the general operation mode determines a product quality as an important factor.

Further, if the detection voltage is increased, the leak current at the maximum operation voltage lessens, whereas if the detection voltage is decreased, the leak current at the maximum operation voltage increases. In other words, to suppress the leak current, the detection voltage should be set as high as possible.

A permissible upper limit set in the detection voltage circuit is restricted according to the drain breakdown voltage of the protective off-transistor and hence, the drain breakdown voltage needs to be set high.

However, the drain breakdown voltage is determined according to a design rule of the semiconductor process inclusive of a gate oxide film thickness of the MOS transistor, a diffusion region concentration of the drain, a concentration of a field region, or the like. Therefore, it is impossible to increase the drain breakdown voltage alone without a careful consideration in the case of following up the preset semiconductor process.

The problem about the increased leak current is mostly conspicuous in the IC with a wide operation temperature range, which is particularly capable of operating at a low temperature.

Also, in many cases, the above problem is conspicuous in the IC having the wide power source voltage range in the general operation mode, in particular, the high maximum operation voltage.

Further, the above problem is particularly conspicuous when the drain breakdown voltage of the off-transistor used as the protective transistor is low in many cases.

In addition, the above problem is often conspicuous particularly when a subthreshold current amount of the NMOS transistor constituting the voltage detection circuit is large.

SUMMARY OF THE INVENTION

Therefore, according to the present invention, the following means is employed in order to solve the above-mentioned problem.

According to the present invention, there is provided a semiconductor memory device including:

an external terminal to which a voltage for switching to a test operation mode is applied;

a protective transistor connected between the external terminal and a ground; and a voltage detection circuit for detecting a voltage of the external terminal and outputting a signal for switching a first operation mode to a second operation mode when the detected voltage is a predetermined voltage or higher, in which the protective transistor has a drain region surrounded by a gate electrode.

Further, in the semiconductor memory device according to the present invention, the voltage detection circuit has a plurality of MOS transistors connected in series between the external terminal and the ground and outputs the signal from a node among the MOS transistors connected in series, the MOS transistor connected to the external terminal including a high breakdown voltage MOS transistor.

DESCRIPTION OF THE PREFERRED EMBODIMENTS

Figure 1:
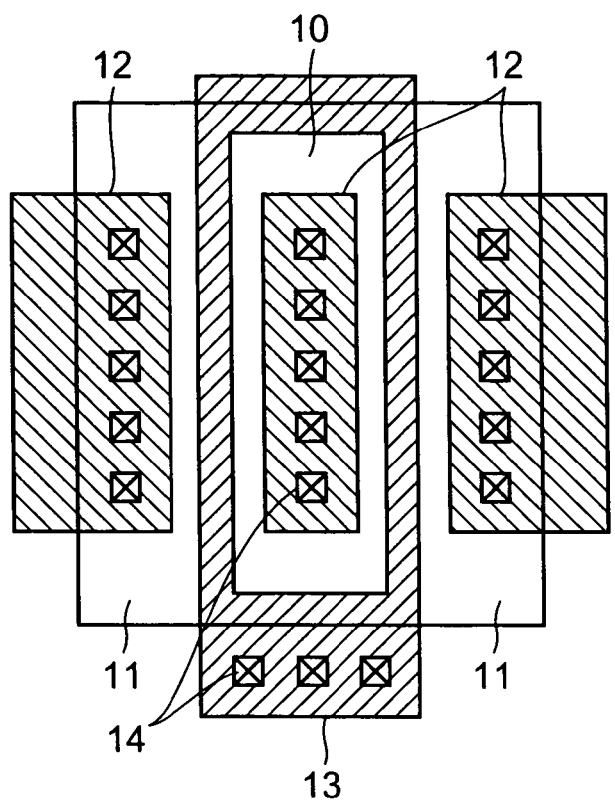
FIG. 1 is a plan view showing a protective transistor according an embodiment of the present invention.
Figure 2:
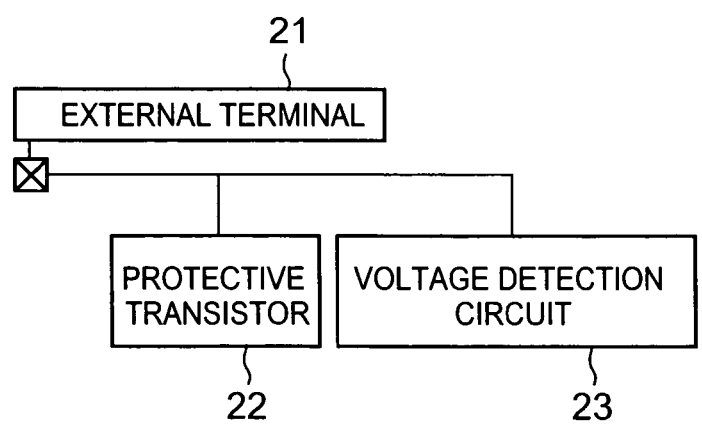
FIG. 2 is a block diagram according to the present invention.
Figure 3:
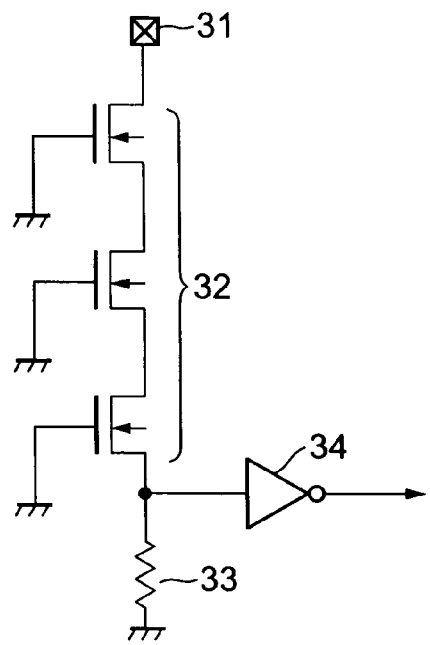
FIG. 3 shows a conventional voltage detection circuit.
Figure 4:
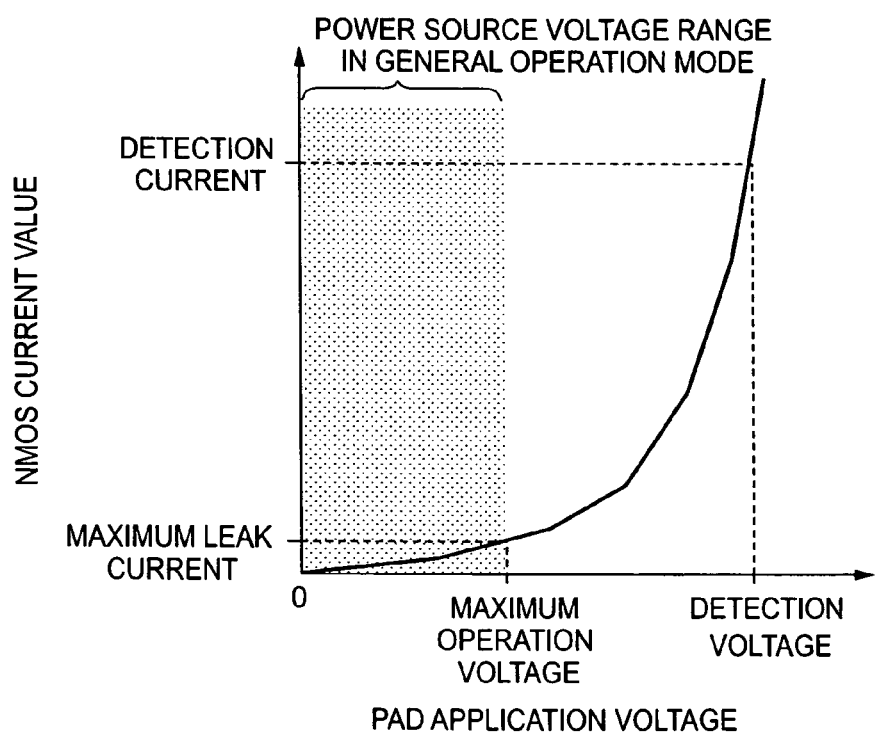
FIG. 4 is a characteristic graph of a voltage detection circuit.

Embodiments of the present invention will be described hereinafter. FIG. 1 is a plan view of a protective transistor according to one embodiment of the invention aimed to increase a drain breakdown voltage.

The transistor of FIG. 1 is structured such that: contacts 14 are formed at a drain region 10 and a source region 11, respectively, which are electrically isolated by a gate electrode 13 electrically connected to each metal electrode 12; and the drain region 10 and the source region 11 are respectively connected to the metal electrode 12 through the contact 14, thereby obtaining desired electrical characteristics.

The transistor is directly connected to an external terminal and directly given a noise from the outside therefore the transistor is required to a high noise resistance.

In the structure of the present invention shown in FIG. 1, the drain region 10 is surrounded by the gate electrode 13, which in this embodiment is formed of a polysilicon layer. With this structure, an electrical isolation between the drain region 10 and an element isolation region is kept with a junction diode functioning as a field effect transistor of the gate electrode 13 at an end in a channel length direction. A uniformity of a current path for a noise or static electricity is achieved, thereby making it possible to increase the drain breakdown voltage.

By adopting a transistor layout according to the present invention for the protective transistor of the external terminal equipped with the voltage detection circuit for switching the mode to the test operation mode, the detection voltage of the voltage detection circuit can be set high, which can lead to realization of a circuit capable of reducing the terminal leak current.

According to the present invention, a simple adjustment is performed on the layout of the gate region of the protective transistor, with the result that the terminal leak current can be minimized in a simple manner. It is possible to attain the purpose with absolutely no change in process bias in the semiconductor process.

Figure 5:
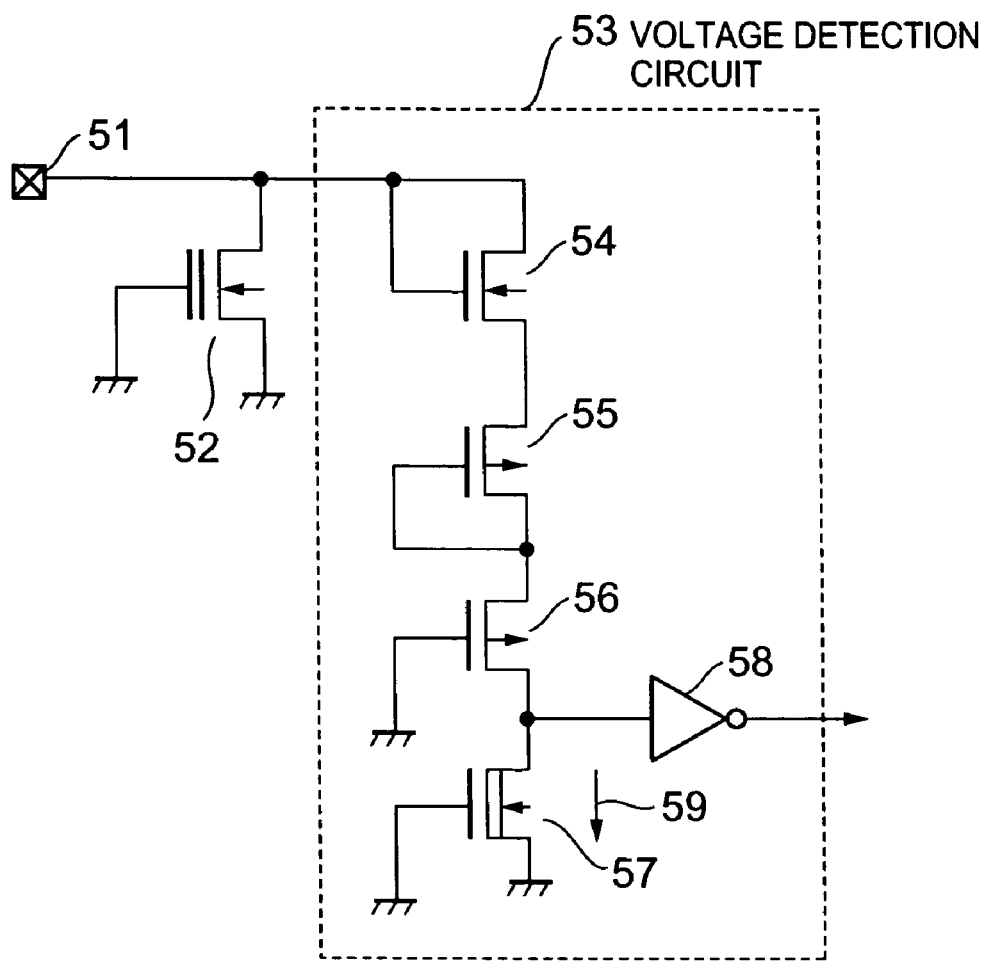
FIG. 5 shows a structure of the protective transistor according to the embodiment of the present invention shown in FIG. 1.
Figure 6:
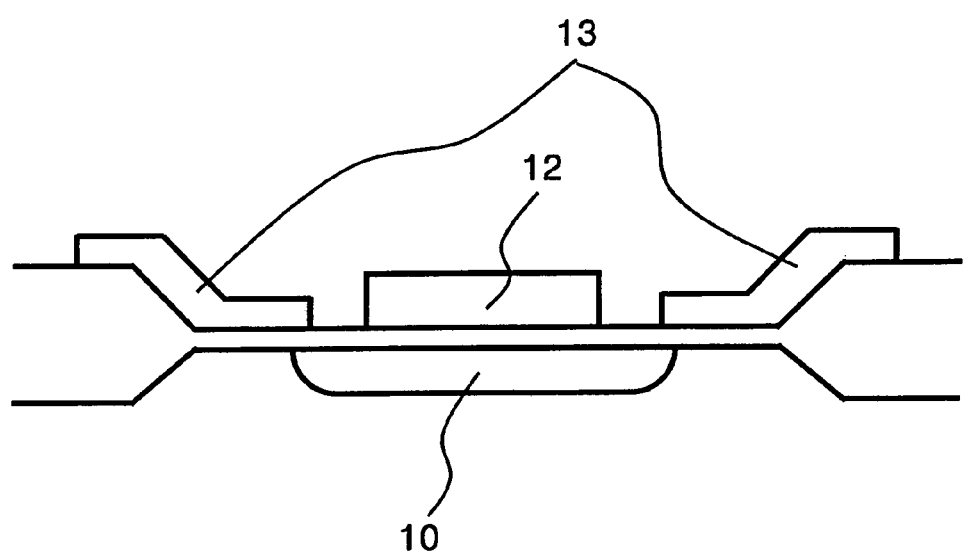
FIG. 6 shows another embodiment of the protective transistor according to the present invention.

FIG. 5 shows an embodiment to which the present invention is applied. In FIG. 5, a circuit is constituted of an external terminal 51 to which a high voltage for switching the mode to the test operation mode is applied, a protective transistor 52 connected to the external terminal 51 for protecting the IC when subjected to electrostatic noise, and a voltage detection circuit 53 for detecting a high voltage for switching an operation mode to a test operation mode.

The voltage detection circuit 53 has an external terminal connected with a drain of an NMOS transistor 54 whose source is connected with a PMOS transistor 55 in a state of being saturation-connected. A drain of the PMOS transistor 55 is connected to a PMOS transistor 56. A gate voltage of the PMOS transistor 56 is grounded. A drain of the PMOS transistor 56 is connected with an NMOS depression transistor 57 whose gate voltage is grounded. A constant current 59 is thus allowed to flow therethrough. The PMOS transistor 56 has an increased threshold voltage because a total voltage of the voltages generated by the NMOS transistor 54 and the PMOS transistor 55 is allotted to a back-gate voltage. When the voltage not smaller than the threshold voltage of the PMOS transistor 56 is applied to the external terminal while counting in the back-gate voltage, an ON current flows through the PMOS transistor 56. If the ON current is beyond the constant current 59, an output level of an inverter 58 is changed from an H level to an L level, thereby switching the mode to the test operation mode.

The NMOS transistor 54 is constituted of a MOS transistor of a high breakdown voltage, which generally has as high drain junction breakdown voltage of about 20 V.

The protective transistor 52 is constituted of a MOS transistor of a low breakdown voltage, which generally has the drain junction breakdown voltage of about 12 V. By using the protective transistor structured based on the layout of the present invention, the drain junction breakdown voltage can be made about 1 to 3 V higher than before.

As set forth above, according to the present invention, a semiconductor memory device can be provided which suppresses a terminal leak current in the test operation mode.

What is claimed is:

1. A semiconductor memory device comprising:
an external terminal receptive of a voltage for switching an operation mode;
a protective transistor connected between the external terminal and a ground, the protective transistor having a drain region and a gate electrode surrounding the drain region; and
a voltage detection circuit for detecting a voltage of the external terminal and outputting a switching signal for switching a first operation mode to a second operation mode when a value of the detected voltage is equal to or higher than a preselected voltage value.

2. A semiconductor memory device according to claim 1; wherein the voltage detection circuit has a plurality of MOS transistors connected in series between the external terminal and the ground, one of the MOS transistors having a high breakdown voltage; and wherein the voltage detection circuit outputs the switching signal from a node in the serially connected MOS transistors.

3. A semiconductor memory device according to claim 1; wherein the voltage detection circuit has a first NMOS transistor having a drain connected to the protective transistor, a first PMOS transistor connected to a source of the first NMOS transistor, a second PMOS transistor connected to a drain of the first PMOS transistor, and a second NMOS transistor connected to a drain of the second PMOS transistor.

4. A semiconductor memory device according to claim 3; wherein the first NMOS transistor has a high breakdown voltage.

5. A semiconductor memory device according to claim 4; wherein the protective transistor comprises a MOS transistor having a low breakdown voltage.

6. A semiconductor memory device comprising:
an external terminal receptive of a voltage for switching between first and second operation modes of the semiconductor memory device;
a protective transistor connected directly to the external terminal and having a drain region and a gate electrode surrounding the drain region for suppressing a terminal leak current in at least one of the first and second operation modes; and
a voltage detection circuit for detecting a voltage of the external terminal and outputting a switching signal for switching from the first operation mode to the second operation mode.

7. A semiconductor memory device according to claim 6; wherein the voltage detection circuit has a plurality of MOS transistors connected in series between the external terminal and a ground, one of the MOS transistors having a high breakdown voltage; and wherein the voltage detection circuit outputs the switching signal from a node in the serially connected MOS transistors.

8. A semiconductor memory device according to claim 6; wherein the voltage detection circuit has a first NMOS transistor having a drain connected to the protective transistor, a first PMOS transistor connected to a source of the first NMOS transistor, a second PMOS transistor connected to a drain of the first PMOS transistor, and a second NMOS transistor connected to a drain of the second PMOS transistor.

9. A semiconductor memory device according to claim 8; wherein the first NMOS transistor has a high breakdown voltage.

10. A semiconductor memory device according to claim 9; wherein the protective transistor comprises a MOS transistor having a low breakdown voltage.

11. A semiconductor memory device comprising:
an external terminal receptive of a voltage for switching an operation mode;
a protective transistor connected between the external terminal and a ground, the protective transistor having a drain region and a gate electrode disposed in overlapping relation with an end of the drain region; and
a voltage detection circuit for detecting a voltage of the external terminal and outputting a switching signal for switching a first operation mode to a second operation mode when a value of the detected voltage is equal to or higher than a preselected voltage value.

12. A semiconductor memory device according to claim 11; wherein the voltage detection circuit has a plurality of MOS transistors connected in series between the external terminal and a ground, one of the MOS transistors having a high breakdown voltage; and wherein the voltage detection circuit outputs the switching signal from a node in the serially connected MOS transistors.

13. A semiconductor memory device according to claim 11; wherein the voltage detection circuit has a first NMOS transistor having a drain connected to the protective transistor, a first PMOS transistor connected to a source of the first NMOS transistor, a second PMOS transistor connected to a drain of the first PMOS transistor, and a second NMOS transistor connected to a drain of the second PMOS transistor.

14. A semiconductor memory device according to claim 13; wherein the first NMOS transistor has a high breakdown voltage.

15. A semiconductor memory device according to claim 14; wherein the protective transistor comprises a MOS transistor having a low breakdown voltage.

* * * * *